(12) United States Patent
Ni et al.

(10) Patent No.: US 8,232,852 B2
(45) Date of Patent: Jul. 31, 2012

(54) DUAL-TRACK SURFACE-WAVE FILTER

(75) Inventors: Shanlin Ni, Jiangsu (CN); Weibiao Wang, Jiangsu (CN)

(73) Assignee: Shoulder Electronics Co., Ltd., Wuxi, Jiangsu (CN)

( * ) Notice: Subject to any disclaimer, the term of this patent is extended or adjusted under 35 U.S.C. 154(b) by 0 days.

(21) Appl. No.: 12/599,299

(22) PCT Filed: Dec. 24, 2008

(86) PCT No.: PCT/CN2008/073708
§ 371 (c)(1),
(2), (4) Date: Nov. 8, 2009

(87) PCT Pub. No.: WO2010/000122
PCT Pub. Date: Jan. 7, 2010

(65) Prior Publication Data
US 2011/0260805 A1    Oct. 27, 2011

(30) Foreign Application Priority Data

Jul. 4, 2008    (CN) .......................... 2008 1 0124217

(51) Int. Cl.
*H03H 9/64*    (2006.01)
*H03H 9/145*    (2006.01)
(52) U.S. Cl. .................................... 333/196; 310/313 C
(58) Field of Classification Search .......... 333/193–196; 310/313 R, 313 B, 313 C, 313 D
See application file for complete search history.

(56) References Cited

U.S. PATENT DOCUMENTS

| 4,390,807 A | * | 6/1983 | Kishimoto et al. | ....... | 310/313 B |
| 4,558,364 A | * | 12/1985 | Yamada | ......................... | 348/736 |
| 4,604,595 A | * | 8/1986 | Kadota | ......................... | 333/196 |
| 5,107,234 A | * | 4/1992 | Ehrmann-Falkenau et al. | .............................. | 333/195 |
| 5,309,057 A | | 5/1994 | Yamamoto | | |
| 5,867,075 A | * | 2/1999 | Fischerauer | ................... | 333/193 |
| 2005/0121998 A1 | * | 6/2005 | Orito et al. | ................ | 310/313 B |

FOREIGN PATENT DOCUMENTS

| CN | 101316099 A | 12/2008 |
| EP | 1655837 A2 | 5/2006 |
| JP | 56-126309 A | 10/1981 |
| JP | 59-123305 A | 7/1984 |
| JP | 2-189015 A | 7/1990 |
| JP | 4-298111 A | 10/1992 |
| JP | 10-178332 A | 6/1998 |
| JP | 2005-176338 A | 6/2005 |

\* cited by examiner

*Primary Examiner* — Barbara Summons
(74) *Attorney, Agent, or Firm* — George G. Wang; Bei & Ocean

(57) ABSTRACT

The present invention relates to an integrated dual-track surface-wave filter comprising two input interdigital transducers, an output interdigital transducer, and a shield stripe therebetween, which are integrated on a piezoelectric wafer. The integrated dual-track surface-wave filter is characterized in that the two input interdigital transducers share one output interdigital transducer and one comb-like electrode that has a bus bar arranged at the middle thereof, and in that main lobe regions of apodized envelope curves on the two parallel input interdigital transducers are staggered to be at cross overlapping positions, and in that the bus bar on the common comb-like electrode is segmented to connect respective fingers on the two input interdigital transducers. In this manner, the present invention effectively narrows the chip area occupied, consumes less substrate materials and decreases the volume of the encapsulated enclosure, thereby reducing the manufacture cost effectively.

4 Claims, 5 Drawing Sheets

DUAL-TRACK SURFACE-WAVE FILTER

FIELD OF THE INVENTION

The present invention relates to a band-pass filter, and more particularly, to a surface-wave band-pass filter integrated on a crystal, piezoelectric material.

BACKGROUND OF THE INVENTION

If a voltage is applied to an electrode of a substrate material (e.g., a single-crystal lithium niobate substrate) having piezoelectric characteristics, mechanical deformation is formed in the lattice of the crystal, piezoelectric material. And if the voltage applied to an electrode of a crystal, piezoelectric material is an input electrical signal, a surface wave is generated in the lattice at the surface of the crystal, piezoelectric material. The surface wave is an elastic, mechanical wave that propagates along the surface of the crystal, piezoelectric material, and its amplitude fast decreases as it deepens into the substrate material.

Surface-wave filters have band-pass filter characteristics. The band-pass filter functionality of surface-wave filters is fulfilled on the basis of surface waves generated in the lattice. The basic configuration of surface-wave filters is as follows: two aluminum films each of about 0.1 um thickness are fabricated on the polished surface of a substrate material (e.g., a single-crystal lithium niobate substrate) having piezoelectric characteristics, and on the aluminum film layer is formed a structure of crossed, paired comb-like aluminum electrodes by photo etching process, and when a transmitted electrical signal is applied to the comb-like electrode structure, a surface wave is formed between fingers of these two comb-like electrodes, whereby this comb-like electrode structure functions as an electroacoustic transducer, which is referred to as an interdigital transducer. Between fingers of the two comb-like electrodes is formed an excitation region of the transducer, and a comb handle portion connecting respective interdigital fingers of each of the two comb-like electrodes is referred to as a bus bar, and signal voltages are applied to the two bus bars of the crossed comb-like electrodes. Interdigital transducers are divided into input transducers and output transducers, with the former converting an electrical signal into a surface-wave signal that propagates along the crystal surface, and the latter converting a received surface-wave signal into an electrical signal to be output. The input and output transducers constitute a surface-wave transmission track that has varying transmission or band-pass characteristics for surface waves dependent on different weighted configurations of the interdigital transducers.

Relevant to the present invention is U.S. Pat. No. 5,107,234 (Apr. 21, 1992), entitled "Surface-Wave Filter with Selectively Connectable Tracks to Provide a Variable Transmission Band". The inventive gist of this patent is to design a surface-wave filter with a switch to replace a plurality of filters having different bandwidths and encapsulated separately, and thereby to reduce cost. This patent comprises at least two surface-wave filters arranged completely parallel and integrated on the same chip, each of which has completely independent input and output transducers forming individual surface-wave transmission tracks arranged in parallel. Different transmission bands of the surface-wave filter are selectable by connecting one of the tracks while connecting or disconnecting the other one. In this manner, a surface-wave filter with a variable transmission band is formed. Since the surface-wave transmission tracks consist of individual input and output transducers arranged in parallel, the surface-wave filter has a larger chip area, thereby consuming more substrate materials.

SUMMARY OF THE INVENTION

In view of the above-discussed disadvantages of existing dual-track surface-wave filters, the present invention provides a dual-track surface-wave filter in another configuration, which effectively reduces the chip area. The technical solution of the present invention is as follows:

A dual-track surface-wave filter comprises two input interdigital transducers, an output interdigital transducer, and a shield stripe therebetween, which are integrated on a piezoelectric wafer, the two input interdigital transducers sharing one output interdigital transducer; the two input interdigital transducers share one comb-like electrode that has a bus bar arranged at the middle thereof; the two input interdigital transducers are two parallel apodization-weighted interdigital transducers, main lobe regions of apodized envelope curves on the two apodization-weighted interdigital transducers being staggered to be at cross overlapping positions.

The common output interdigital transducer is an equal-finger interdigital transducer.

The bus bar on the common comb-like electrode is formed of segments each connecting a respective interdigital finger on the two apodization-weighted interdigital transducers.

With the present invention, the dual-track filter functionality is integrated and carried out on the same chip within a standardly encapsulated enclosure. Since the two parallel apodization-weighted interdigital transducers share one comb-like electrode and the bus bar thereon, and the main lobe regions of apodized envelope curves on the two apodization-weighted transducers are staggered to be at cross overlapping positions, the present invention effectively narrows the chip area occupied, consumes less substrate materials and decreases the volume of the encapsulated enclosure, thereby reducing the manufacture cost effectively.

The various features of novelty which characterize the invention are pointed out with particularity in the claims annexed to and forming a part of this disclosure. For a better understanding of the invention, its operating advantages, and specific objects attained by its use, reference should be made to the drawings and the following description in which there are illustrated and described preferred embodiments of the invention.

DETAILED DESCRIPTION OF PARTICULAR EMBODIMENTS OF THE INVENTION

Hereinafter is the detailed description, taken in combination with the accompanying drawings, of the embodiments of the present invention.

Figure 1:
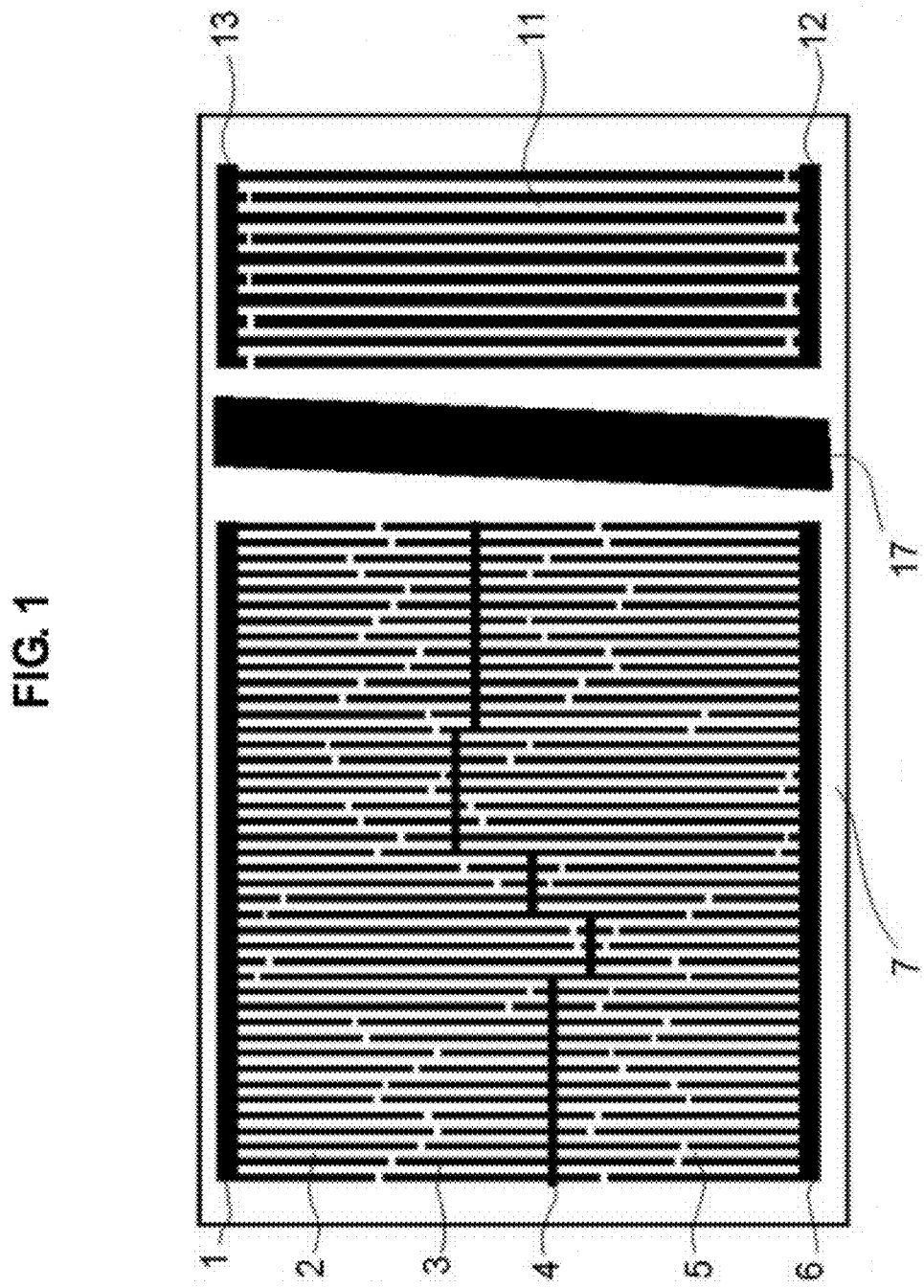
FIG. 1 depicts a schematic layout view of an embodiment of the present invention.
Figure 2:
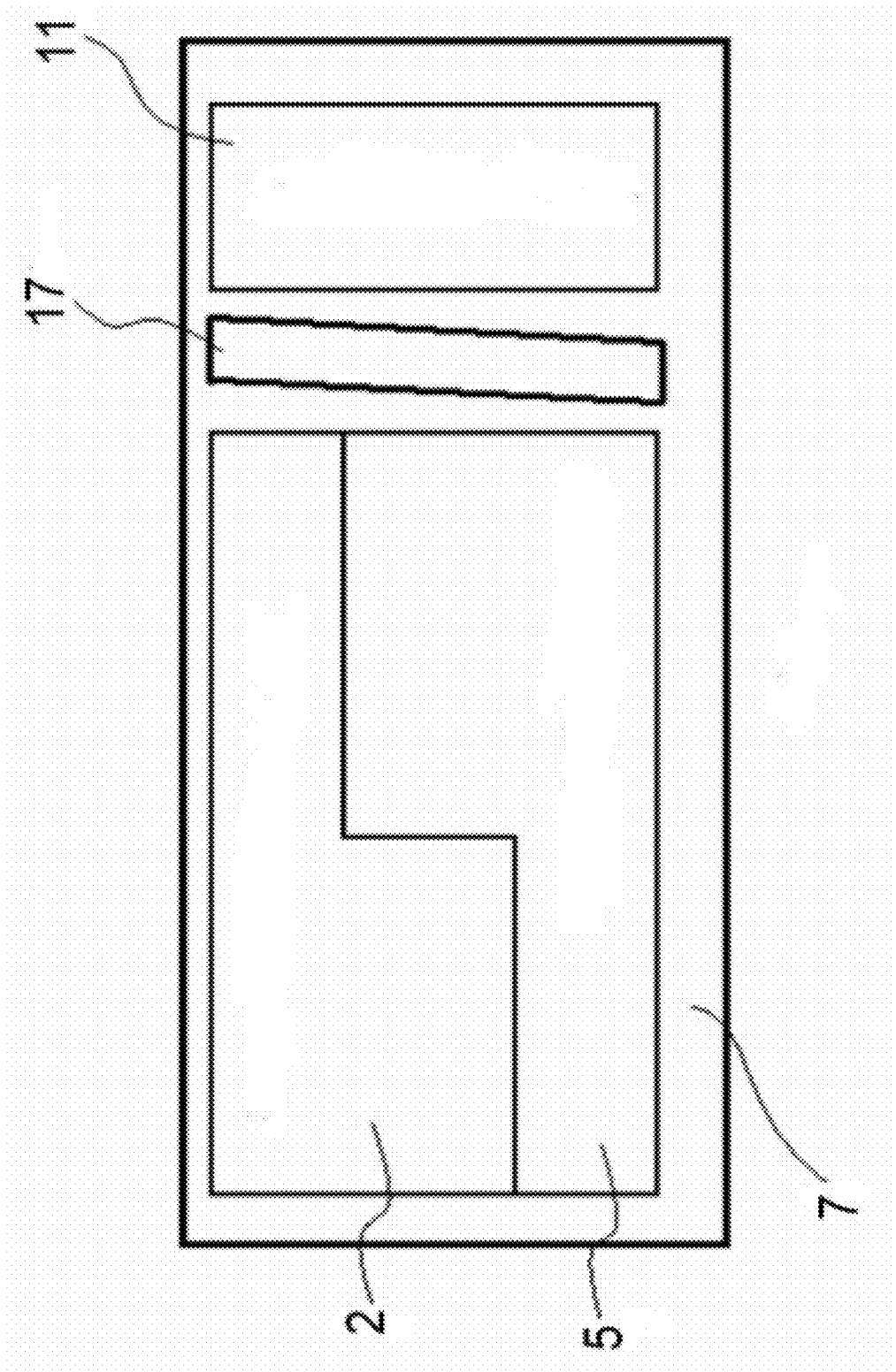
FIG. 2 depicts a schematic functional and layout view of FIG. 1.
Figure 3:
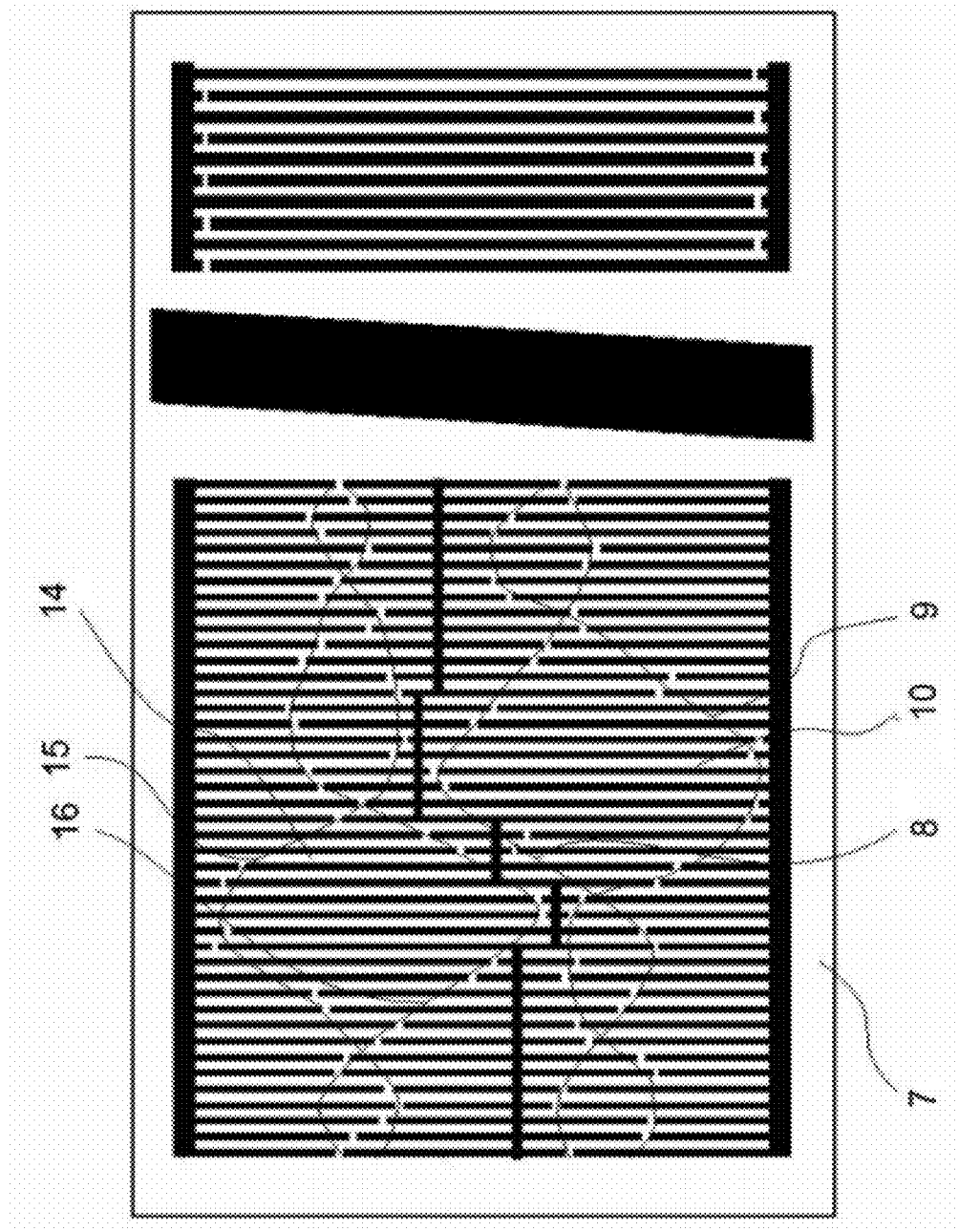
FIG. 3 depicts a schematic layout view of apodization-weighted envelope curves on the input interdigital transducer of FIG. 1.

Referring to FIG. 1 through FIG. 3, the present invention comprises two surface-wave transmission tracks A, B integrated on a piezoelectric wafer 7 and each consisting of input interdigital transducers 2, 5, an output interdigital transducer 11 and a shield stripe 17 therebetween. The input interdigital transducers 2, 5 of the two surface-wave transmission tracks A, B share one output interdigital transducer 11, which is an equal-finger interdigital transducer. The two surface-wave transmission tracks A, B constituted as such form two surface-wave transversal filters. The sharing of one output interdigital transducer 11 causes the output impedances of the two filters to be completely equal, thereby making it convenient for circuit matching. The input interdigital transducers 2, 5 convert electrical energy into surface-wave mechanical energy. The output interdigital transducer 11, in turn, converts surface-wave mechanical energy into electrical energy. In this manner, signals are filtered and transmitted. The input interdigital transducers of these two surface-wave transmission tracks shares one comb-like electrode 3 having a bus bar 4 arranged in the middle. The bus bar 4 of the common comb-like electrode 3 is segmented, with each segment connecting a respective interdigital finger of the two apodization-weighted interdigital transducers 2, 5. The input interdigital transducers 2, 5 of the two surface-wave transmission tracks are two parallel apodization-weighted interdigital transducers. Referring to FIG. 3, main lobe regions 10, 14 respectively formed by apodization envelope curves 8, 9 and 15, 16 on the two apodization-weighted interdigital transducers are staggered to be at cross overlapping positions. Hence, a width of a chip of the dual-track surface-wave filter is narrowed significantly, just as shown in FIG. 1.

Figure 5:
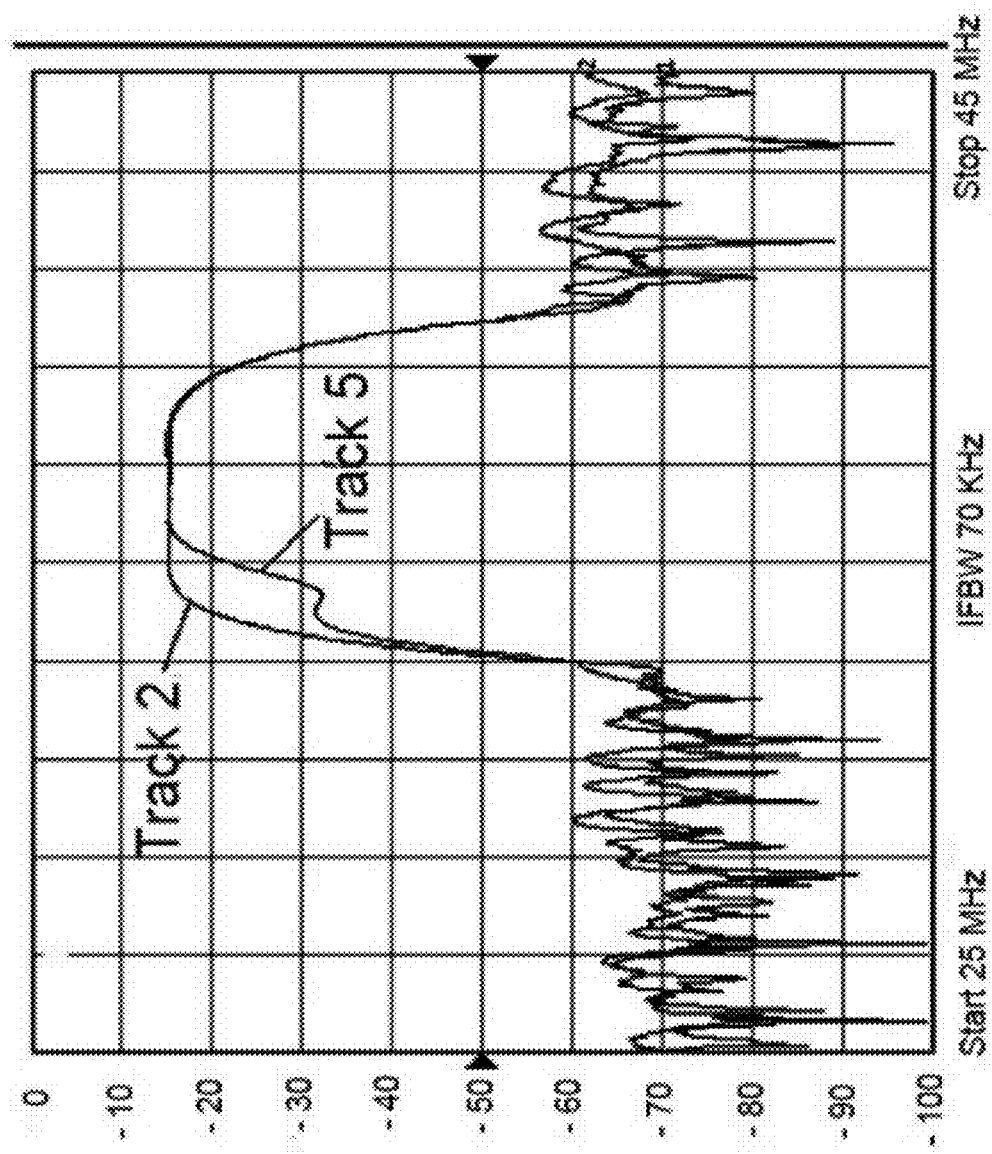
FIG. 5 is a schematic spectral view of an embodiment of FIG. 1.

Each of bus bars 1, 4, 6, 12, and 13 in FIGS. 1 and 3 is a conductive port that is connected via a pressure solder wire to a lead pin encapsulating the enclosure. Each of the input or output interdigital transducers has two bus bars. The input conductive ports 1, 4, and 6 each select different conductive modes, and accordingly, the dual-track surface-wave filter has different electrical performance, e.g., may have various performance such as central frequency, bandwidth, squareness factor, and out-band suppression, just as shown in FIG. 5. When the two bus bars of the input interdigital transducer lie at different potentials, this interdigital transducer will excite a surface wave. For example, in FIGS. 1, 2, and 3, if the conductive ports 1 and 4 lie at different potentials while 4 and 6 at the same potential, then the input interdigital transducer 2 operates while 5 does not operate. If the conductive ports 1 and 4 lie at the same potential while 4 and 6 at different potentials, then the interdigital transducer 2 does not operate while 5 operates. Further, as shown in FIG. 5, if the conductive ports 1 and 4 lie at different potentials and 4 and 6 also at different potentials, then both of the interdigital transducers 2 and 5 operate.

The output interdigital transducer 11 according to embodiments of FIGS. 1 and 3 is an equal-finger interdigital transducer, where the bus bar 4 on the common comb-like electrode 3 is segmented, with each segment connecting a respective interdigital finger of the two apodization-weighted interdigital transducers.

FIG. 3 depicts a schematic layout view of apodization-weighted envelope curves on the input interdigital transducer of FIG. 1. Referring to FIG. 3, the input interdigital transducer obtains desired frequency characteristics by a weighting method varying the interdigital length. In FIGS. 3, 15 and 16 are envelope curves formed by apodization weighting the input interdigital transducer 2, and 8 and 9 are envelope curves formed by apodization-weighting the input interdigital transducer 5. The overlap portion between interdigital fingers of each of the input interdigital transducers 2, 5 forms an excitation region of the interdigital transducer, namely the regions surrounded by envelope curves 15, 16 and 8, 9 in FIG. 3. Within the excitation region electrical energy is converted into surface-wave energy, where regions 14, 10 are excitation main-lobe regions. The output interdigital transducer 11 is an equal-finger interdigital transducer, whose apodized envelopes are of line shape and within whose excitation region received surface-wave energy is converted into electrical energy.

As a practical application of the embodiment of the present invention as shown in FIG. 1, it may be, for example, an intermediate frequency filter of a surface-wave digital or analogous multi-system television receiver, which has a switch. The surface-wave filter switches between different transmission bandwidths through the switch according to a desired system. The surface-wave transmission tracks A, B have different transmission bandwidths. In the embodiment shown in FIG. 2, the track A is a PAL system picture intermediate frequency filter, while the track B is an N system intercarrier intermediate frequency filter. When a high level is input to the port 1 in FIG. 1 or FIG. 3 and a low level is input to the ports 4 and 6, the interdigital transducer 2 of the track A operates while the interdigital transducer 5 of the track B does not operate, whereby the interdigital transducer 2 and the output transducer 11 form an PAL system picture filter. When a high level is input to the ports 1 and 4 and a low level is input to the port 6, the interdigital transducer 2 of the track A does not operate while the interdigital transducer 5 of the track B operates, whereby the interdigital transducer 5 and the output transducer 11 form an N system intercarrier filter. Likewise, other different combination of high and low levels can be selected to be input to the input ports 1, 4, and 6, whereby the interdigital transducers 2, 5 operate separately or simultaneously, so that surface-wave filters having different output bandwidths are obtained.

Figure 4:
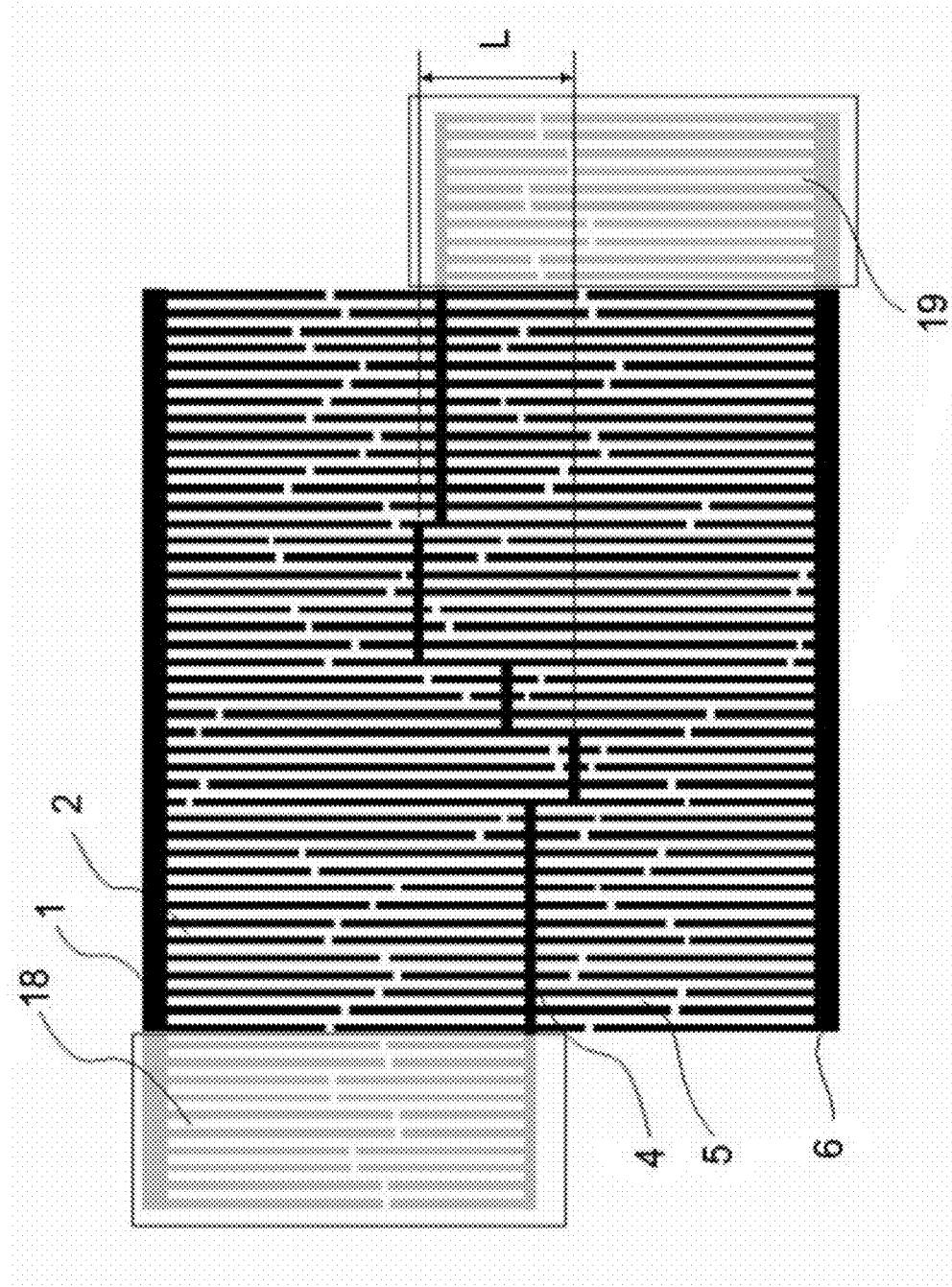
FIG. 4 depicts a schematic view of an apodization weighting method for the input interdigital transducer of FIG. 1.

FIG. 4 depicts a schematic view of an apodization weighting method of the input interdigital transducer of FIG. 1. Referring to FIG. 4, the apodization weighting method for fingers of the input interdigital transducers 2, 5 may be implemented below: first of all, the apodization weighted interdigital transducers 2, 5 of the two tracks of the integrated dual-track surface-wave filter and the shield stripe between the two interdigital transducers are designed separately using a conventional method, where the two interdigital transducers 2, 5 share one output interdigital transducer 11 and arranged in parallel on the chip; the interdigital transducers 2, 5 share one comb-like electrode 3 having a bus bar 4 arranged at the middle thereof; to cause the main lobe regions 10, 14 of the apodization weighted envelope curves on the interdigital transducers 2, 5 to be staggered on the integrated chip so as to be at cross overlapping positions, the main lobe regions 10, 14 of the interdigital transducers 2, 5 are displaced in relation to each other during design. For example, the main lobe region 14 of the first interdigital 2 is displaced towards the left for several wavelengths, and the man lobe region 10 of the second transducer 5 is displaced towards the right for several wavelengths at the same time, so that the main lobe regions 10, 14 of the two interdigital transducers 2, 5 are staggered on the chip, just as shown in FIG. 4. Then, part of fingers 18 at the left side of the interdigital transducer 2 are truncated and discarded, and part of fingers 19 at the right side of the interdigital transducer 5 are truncated and discarded. Next, the interdigital transducers are brought close to each other, so that they and their main lobe regions 10, 14 overlap on the integrated chip, and at this point, the bus bar 4 on the common comb-like electrode 3 is formed of segments each of which connects a respective interdigital finger on the two apodization-weighted interdigital transducers 2, 5. The distance L in FIG. 4 is a narrowed dimension after the interdigital transducers 2, 5 overlap on the integrated chip.

During the design, the length for which the interdigital transducers 2, 5 are to be truncated is calculated in advance and the position of the main lobes of the two interdigital transducers 2, 5 on the integrated chip is determined beforehand, whereby the truncated interdigital transducers 2, 5 have the same length as the present invention so as to ensure a enough long impulse response. Since part of fingers are discarded after the truncation, the impulse response of the interdigital transducers 2, 5 is varied, thereby resulting in change of the surface-wave filter performance. Hence, the apodization weight (apodized envelope curve shape) of fingers of the interdigital transducers 2, 5 are compensated accordingly using a conventional method.

The sharing of one equal-finger receiving transducer 11 also changes the finger length and center of the receiving transducer. Hence, the finger length and center (apodized envelope curve shape) of the receiving transducer 11 are compensated using a conventional method dependent upon the electrical performance index of the filter.

While there have been described and pointed out fundamental novel features of the invention as applied to a preferred embodiment thereof, it will be understood that various omissions and substitutions and changes, in the form and details of the embodiments illustrated, may be made by those skilled in the art without departing from the spirit of the invention. The invention is not limited by the embodiments described above which are presented as examples only but can be modified in various ways within the scope of protection defined by the appended patent claims.

What is claimed is:

1. A dual-track surface-wave filter, comprising two input interdigital transducers, said two input interdigital transducers sharing a single common output interdigital transducer and sharing a common electrode which is a comb-like structure having a central bus bar in the middle, wherein said two input interdigital transducers and said single common output interdigital transducer are disposed on a common piece of piezoelectric material, said two input interdigital transducers are apodization-weighted, each having a main lobe region of an apodized envelope, said lobe regions of said two input interdigital transducers are staggered as a means of reducing the areas occupied by said filter, and said common central bus bar between said two input interdigital transducers is divided into segments to accommodate said staggered main lobe regions.

2. The dual-track surface-wave filter according to claim 1, wherein said two input interdigital transducers and said single common output interdigital transducer are encapsulated in a single chip and said two input interdigital transducers are separated from said common output interdigital transducer by a shield stripe.

3. The dual-track surface-wave filter according to claim 1, wherein each of said two input interdigital transducers has an un-shared electrode with a side bus bar.

4. The dual-track surface-wave filter according to claim 3, wherein said central bus bar and side bus bars are independently configurable to different conductive modes, thereby varying the performance of said filter in terms of one or more parameters selected from the group consisting of frequency, bandwidth, squareness factor and out-band suppression.

* * * * *